United States Patent
Wang et al.

(10) Patent No.: US 10,985,166 B2
(45) Date of Patent: Apr. 20, 2021

(54) METHOD OF FORMING A MEMORY DEVICE

(71) Applicants: UNITED MICROELECTRONICS CORP., Hsin-Chu (TW); Fujian Jinhua Integrated Circuit Co., Ltd., Quanzhou (CN)

(72) Inventors: Hsu-Yang Wang, Tainan (TW); Ping-Cheng Hsu, Taipei (TW); Shih-Fang Tzou, Tainan (TW); Chin-Lung Lin, Hsinchu (TW); Yi-Hsiu Lee, Chiayi County (TW); Koji Taniguchi, Tainan (TW); Harn-Jiunn Wang, Kaohsiung (TW); Tsung-Ying Tsai, Kaohsiung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/177,348

(22) Filed: Oct. 31, 2018

(65) Prior Publication Data

US 2019/0189620 A1 Jun. 20, 2019

(30) Foreign Application Priority Data

Dec. 18, 2017 (CN) .......................... 201711364213.2

(51) Int. Cl.
*H01L 27/108* (2006.01)
*H01L 21/308* (2006.01)
*H01L 21/762* (2006.01)

(52) U.S. Cl.
CPC .... *H01L 27/10885* (2013.01); *H01L 21/3086* (2013.01); *H01L 21/76224* (2013.01); *H01L 27/10823* (2013.01); *H01L 27/10876* (2013.01); *H01L 27/10888* (2013.01); *H01L 27/10891* (2013.01)

(58) Field of Classification Search
None
See application file for complete search history.

(56) References Cited

U.S. PATENT DOCUMENTS

| | | | | |
|---|---|---|---|---|
| 9,159,703 B2 * | 10/2015 | Cho | .................. | H01L 23/49575 |
| 9,159,730 B2 | 10/2015 | Kim | | |
| 9,184,227 B1 | 11/2015 | Kim | | |
| 9,627,201 B2 * | 4/2017 | Nam | .................. | H01L 21/76816 |
| 9,653,294 B2 * | 5/2017 | Kim | .................... | H01L 21/0332 |
| 2010/0164114 A1 * | 7/2010 | Kang | ................ | H01L 27/10885 |
| | | | | 257/773 |

(Continued)

*Primary Examiner* — Long Pham
(74) *Attorney, Agent, or Firm* — Winston Hsu

(57) ABSTRACT

A method for forming a memory device is disclosed, including providing a substrate, forming an isolation structure and plural active regions in the substrate, forming a plurality of island features on the substrate respectively covering two of the terminal portions of the active regions, using the island features as an etching mask to etch the substrate to perform a first etching process to define a first recessed region and plural island structures on the substrate. The island structures respectively comprise the two terminal portions of the active regions and the first recessed region comprises the central portions of the active regions.

7 Claims, 12 Drawing Sheets

(56) References Cited

U.S. PATENT DOCUMENTS

| | | | |
|---|---|---|---|
| 2010/0330793 A1* | 12/2010 | Kim | H01L 21/76897 |
| | | | 438/586 |
| 2011/0221010 A1* | 9/2011 | Baek | H01L 21/76895 |
| | | | 257/401 |
| 2012/0001346 A1* | 1/2012 | Kim | H01L 27/10855 |
| | | | 257/774 |
| 2013/0193549 A1* | 8/2013 | Lee | H01L 21/76897 |
| | | | 257/508 |
| 2014/0015043 A1* | 1/2014 | Lee | H01L 27/10876 |
| | | | 257/331 |
| 2015/0255464 A1* | 9/2015 | Lee | H01L 29/4238 |
| | | | 257/297 |
| 2016/0013094 A1* | 1/2016 | Min | H01L 27/10891 |
| | | | 438/296 |
| 2017/0271340 A1 | 9/2017 | Kim | |

* cited by examiner

A-A'

A-A'

A-A'

METHOD OF FORMING A MEMORY DEVICE

BACKGROUND OF THE INVENTION

1. Field of the Invention

The present invention generally relates to a method for forming a semiconductor memory device, and more particularly, to a method for forming a dynamic random access memory (DRAM) device.

2. Description of the Prior Art

A dynamic random access memory (DRAM) is one kind of volatile memory. A DRAM usually includes an array region including a plurality of memory cells and a peripheral region including control circuits. Typically, a memory cell includes one transistor and one capacitor electrically coupled to the transistor, which is known as a 1T1C cell. A digital data is stored in a memory cell by controlling the transistor to charge or discharge the capacitor. The control circuits in the peripheral region may address each of the memory cells in the array region by plural columns of word lines and plural rows of bit lines traversing through the array region and electrically connected to each of the memory cells to perform reading, writing or erasing data.

In advanced semiconductor manufacturing, DRAM devices having stacked capacitors and buried word lines have become the mainstream technology for their higher degree of integration and better performance. However, as the memory cell size of a DRAM device continues to shrink, it has become more susceptible to the process variations. For example, a troublesome problem confronted in the field of DRAM manufacturing is that the necessary electrical isolation between bit lines and storage nodes has become harder to maintain. The leakage between storage nodes and bit lines may cause the DRAM device fail to function properly.

SUMMARY OF THE INVENTION

In light of the above, one objective of the present invention is directed to provide a dynamic random access memory (DRAM) device and method for forming the same. The DRAM device provided by the present has a larger manufacturing process window to ensure the electrical isolation between the bit lines and the storage nodes.

To achieve the above objective, a method for forming a memory device is provided and including the following steps. First, a substrate is provided. An isolation structure and a plurality of active regions are formed in the substrate, wherein each of the active regions comprises two terminal portions and a central portion between the terminal portions. Subsequently, a plurality of island features are formed on the substrate and respectively covering two of the terminals portions respectively belonging to two of the active regions. After that, a first etching process, using the island features as an etching mask, is performed to the substrate to define a plurality of island structures and a first recessed region surrounding the island structures on the substrate. Thereafter, the island features are removed to expose the island structures.

According to some embodiments, a plurality of word lines are formed in the substrate and each of the active regions are divided into the terminal portions and the central portion by two of the word lines.

According to some embodiments, a liner may be formed on sidewalls of the island features before performing the first etching process.

According to some embodiments, after removing the island features, a plurality of bit lines are formed on the substrate, traversing through the first recessed regions and passing between the island structures, wherein the bit lines overlap the central portions of the active regions, and the island structures are exposed between the bit lines.

According to some embodiments, after forming the bit lines, a spacer structure may be formed on sidewalls of the bit lines, and an interlayer dielectric layer completely filling the spaces between the bit lines. A plurality of openings may be defined in the interlayer dielectric layer and respectively exposing one of the terminal portions of the active regions. A second etching process is then performed to etch the substrate through the openings to define a plurality of second recessed regions on the substrate. After forming a conductive material partially filling the openings and completely covering the second recessed regions, a metal layer is formed on the substrate and completely filling the openings. The metal layer is then patterned to form a plurality of storage node contacts respectively disposed on and electrically connected to one of the terminal portions.

To achieve the above objective of the present invention, a memory device is provided. The memory device includes a substrate having an isolation structure and a plurality of active regions formed therein, a plurality of word lines formed in the substrate and dividing each of the active regions into two terminal portions and a central portion between the terminal portions, a plurality of island structures respectively comprising two of the terminal portions respectively belonging to two of the active regions, a first recessed region surrounding the island structures and comprising the central portions of the active regions, and a plurality of bit lines on the substrate, traversing through the first recessed regions and passing between the plurality of island structures. The bit lines overlap the central portions of the active regions, and the island structures are exposed between the bit lines.

According to some embodiments, the island structures are disposed between the word lines, and the bit lines stride across central portions of the island structures.

According to some embodiments, the island structures overlap on the word lines, and the bit lines pass between the island structures.

According to some embodiments, the each of the island structures further comprises a portion of the isolation structure, and the first recessed region further comprises a portion of isolation structure outside the island structures.

According to some embodiments, the memory device according to the present invention further comprises a spacer structure on sidewalls of the bit lines, an interlayer dielectric layer on the substrate and between the bit lines, a plurality of openings in the interlayer dielectric layer, and a plurality of storage node contacts respectively in one of the openings to electrically connect to one of the terminal portions, wherein the storage node contacts are electrically isolated from the bit lines by the spacer structure It is one feature of the present invention that, during the step of recessing the central portions of the active regions for forming the bit line contacting regions, the terminal portions of the active regions for forming storage node contacting regions are covered and protected by island features from being etched. Advantageously, the spaces between the island features allow the gaseous etchant of the etching process flowing more evenly on the substrate, and therefore more uniform recessed depths of the central portions of the active regions may be achieved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic diagrams sequentially illustrating the steps for forming a memory device according to a first embodiment of the present invention, in which:

FIG. 1 shows the memory device after forming active regions, isolation structure and word lines in a substrate;

FIG. 2 shows the memory device after forming island features on the substrate;

FIG. 3 shows the memory device after forming island structures and first recessed region on the substrate;

FIG. 4 shows the memory device after forming bit lines on the substrate;

FIG. 5 shows the memory device after forming spacers on sidewalls of the bit lines;

FIG. 6 shows the memory device after forming second recessed regions on the substrate; and FIG. 7 shows the memory device after forming storage nodes contacts on the second recessed regions.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Please refer to FIG. 1 to FIG. 7, which are schematic diagrams sequentially illustrating the steps for forming a memory device 100 according to a first embodiment of the present invention. The upper portions of FIG. 1 to FIG. 7 are top views. The lower portions of FIG. 1 to FIG. 7 are cross-sectional views taken along lines A-A' in FIG. 1 to FIG. 7, respectively. More particularly, each lines A-A' cuts through the substrate 10 between two neighboring word lines 16 and extends along the extending direction (the Y direction) of word lines 16.

Figure 1:
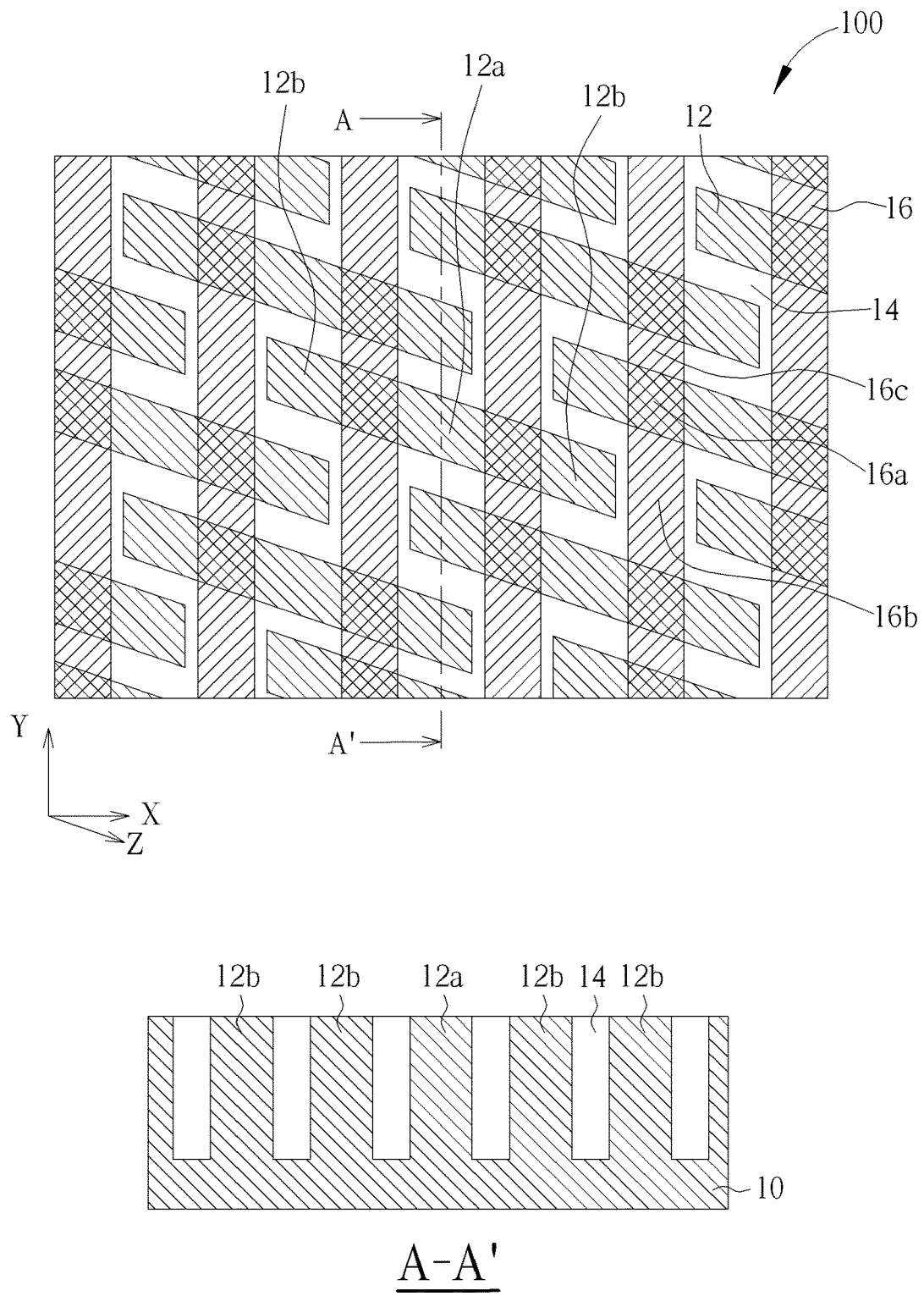

First, as shown in FIG. 1, a substrate 10 is provided. An isolation structure 14 is formed in the substrate and defines a plurality of active regions 12 in the substrate 10. The active regions 12 may extend lengthwise along a Z direction and have a pair of longer sides and a pair of shorter sides. The active regions 12 may be arranged end-to-end and aligned along the Z direction and be arranged side-by-side in a staggered manner along a Y direction. The Y direction and the Z direction are not perpendicular. The Y direction and the Z direction may define an angle between 70 and 75 degrees. According to an embodiment, the substrate 10 may be a silicon substrate, an epitaxial substrate, a silicon germanium substrate, a silicon carbide substrate, or a silicon-on-insulator (SOI) substrate, but not limited thereto. The isolation structure 14 may be a shallow trench isolation structure that is formed by, for example, forming a patterned mask layer (not shown) on the substrate 10 and using the patterned mask layer as an etching mask to etch the substrate 10 to form an isolation trench (not shown) in the substrate 10. After that, an insulating material, such as silicon oxide or silicon nitride, is formed on the substrate 10 to fill the isolation trench. A planarization process is then performed to remove the insulating material outside the isolation trench. The insulating material remaining in the isolation trench becomes the isolation structure 14.

Figure 7:
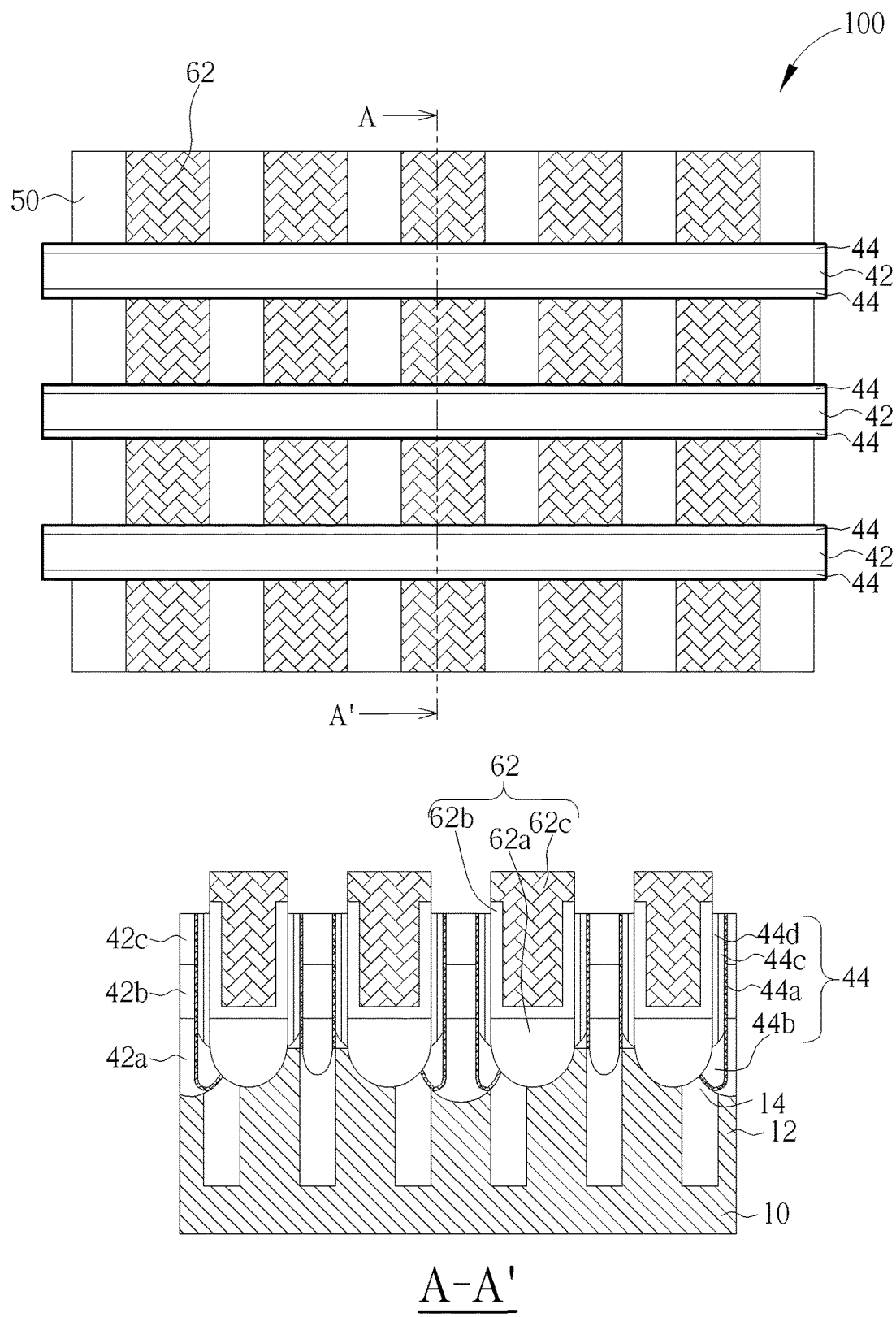

After forming the active regions 12 and isolation structure 14, a plurality of buried word lines 16 are formed in the substrate 10. For example, a plurality of gate trenches (not shown) extending along a Y direction may be defined in the substrate 10 and cut through the active regions 12 and isolation structure 14 along the Y direction. After forming a gate dielectric layer (not shown) covering the gate trenches, a conductive material (not shown), such as tungsten or other suitable metals, is formed on the substrate 10 and fills up the gate trenches. The conductive material is then etched back to only fill lower portions of the gate trenches. An insulating material (not shown), such as silicon nitride or other suitable insulating materials, is then formed on the substrate to fill up the remaining portions of the gate trenches to finish the buried word lines 16. As shown in FIG. 1, each active region 12 is intersected by two word lines 16 and is divided into three parts, including a central portion 12a and two terminal portions 12b at two sides of the central portion 12a. Each central portion 12a will be recessed to form a bit line contacting region and will be electrically coupled to a bit line contact. Each terminal portion 12b will be recessed to form a storage node contacting region and would be electrically coupled to a storage node contact 62 (formed later as shown in FIG. 7). The regions of the buried word lines 16 intersecting the active regions 12 are gate regions 16a. The regions of the buried word lines 16 intersecting the isolation structure 14 between shorter sides (terminal portions 12b) of active regions 12 are first passing gate regions 16b. The regions of the buried word lines 16 intersecting the isolation structure 14 between longer sides of active regions 12 are second passing gate regions 16c.

Figure 2:
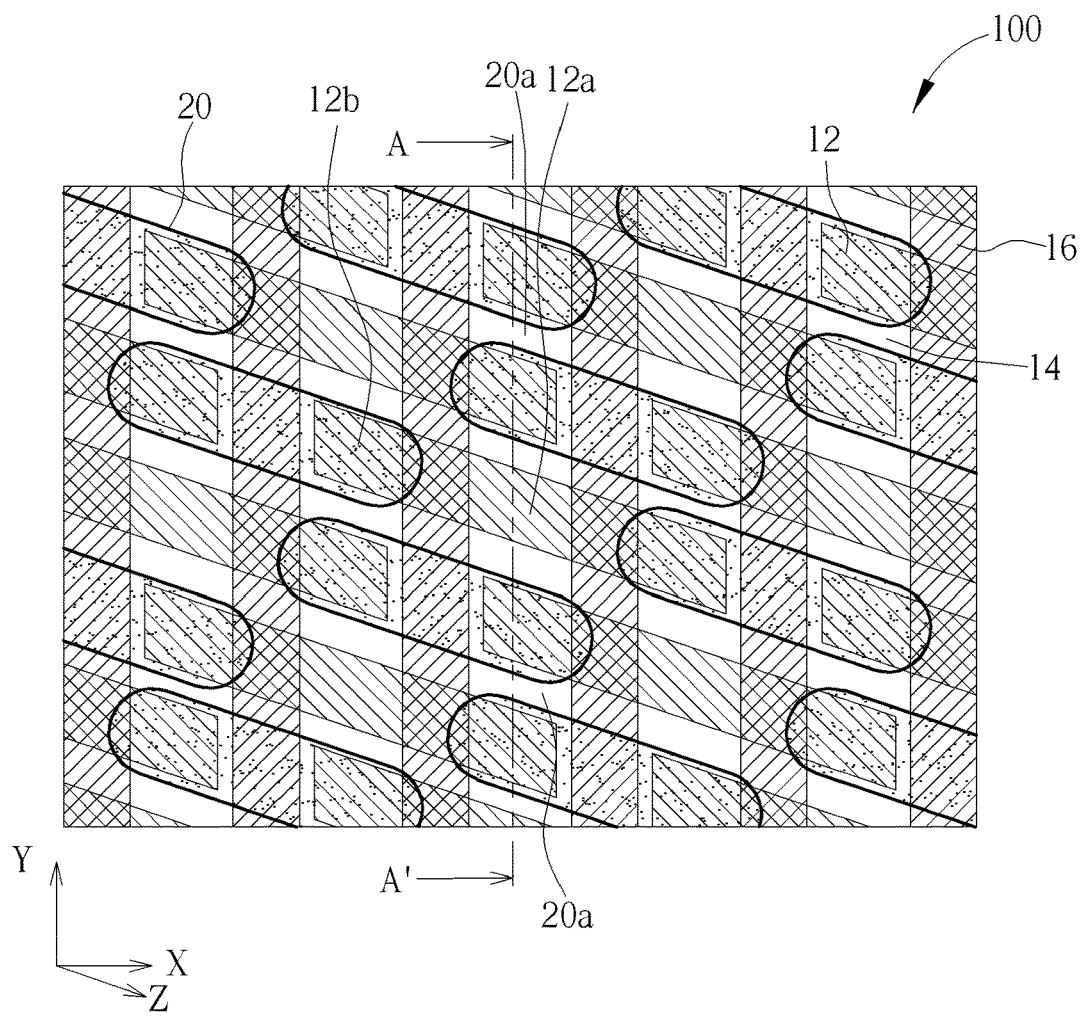
Figure 2:
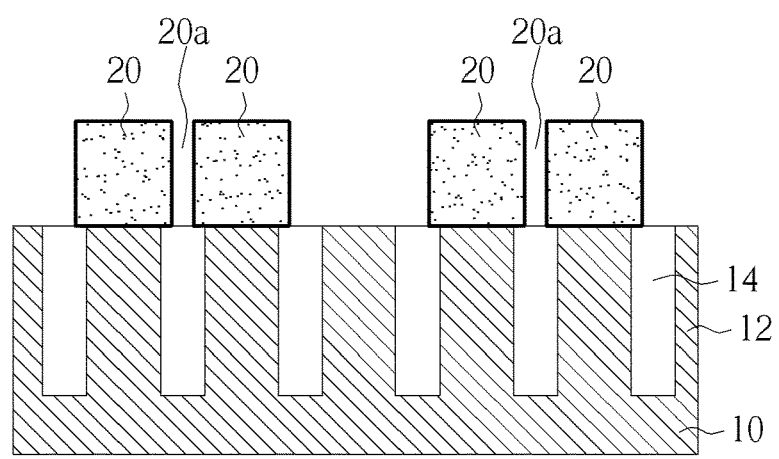

Please refer to FIG. 2. Subsequently, a plurality of island features 20 is formed on the substrate 10. Each island feature 20 vertically overlaps on one of the first passing gate regions 16b and extends along the Z direction to completely cover the two nearby terminal portions 12b at two sides of the first passing gate region 16b. The island features 20 do not cover any portion of the central portions 12a of the active regions 12. The island features 20 are made of a material having etching selectivity with respect to the substrate 10 (the active region 12) and the isolation structure 14. For example, when the substrate 10 is made of silicon and the isolation structure is made of silicon oxide, the island features 20 may be made of a photoresist material or an organic dielectric material. Alternatively, in some embodiment, the island features 20 may comprise hard mask materials, such as silicon nitride, silicon oxynitride or silicon carbon nitride, but not limited thereto. As shown in FIG. 2, the island features 20 are spaced apart from each other. It is noteworthy that the spaces 20a between island features 20 may expose a portion of the isolation structure 14 between the terminal portions 12b. Optionally, a pad layer (not shown), such as a silicon oxide layer, may be formed on the substrate 10 before forming island features 20.

Figure 3:
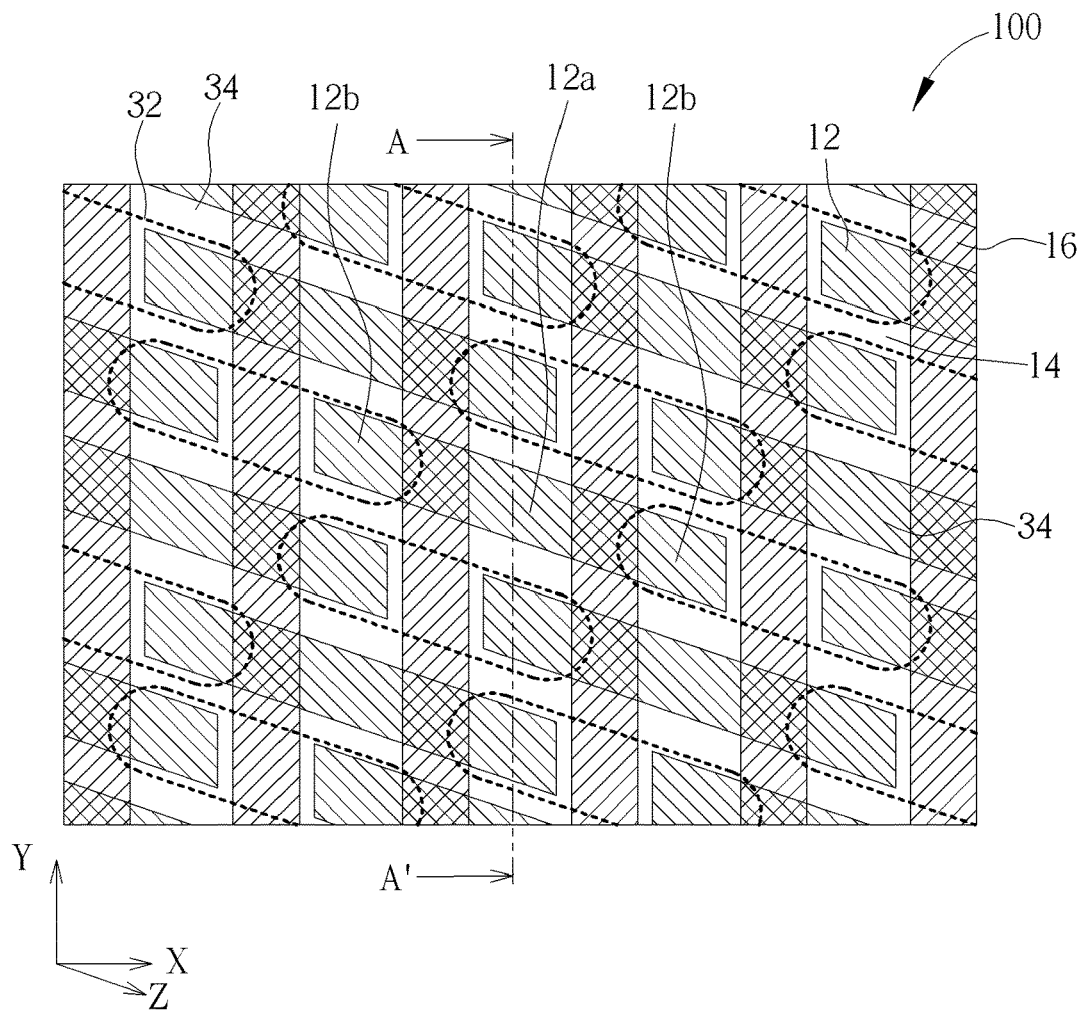
Figure 3:
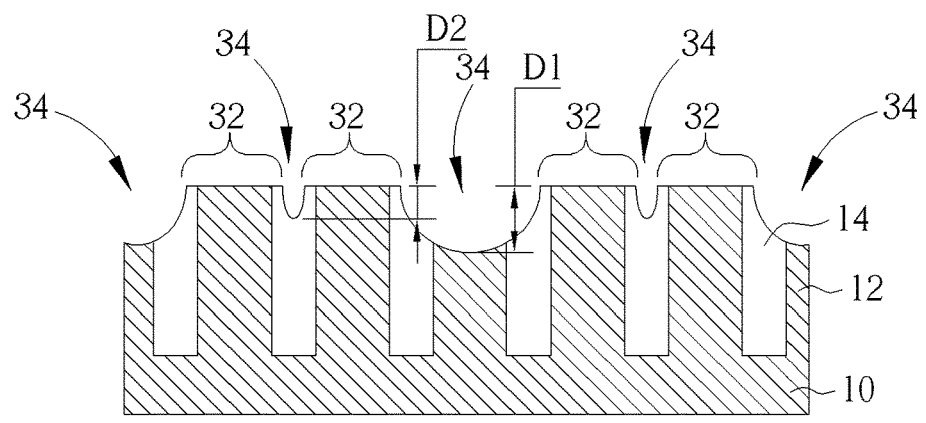

Please refer to FIG. 3. Subsequently, a first etching process, such as a dry etching process is performed, using the island features 20 as an etching mask to etch the exposed portions of the active regions 12, the isolation structure 14 and the word lines 16 (the insulating gap layer of the word lines 16). After the first etching process, the island features 20 may be removed from the substrate 10. The portions of the active regions 12 (the central portions 12a), the isolation structure 14 and the word lines 16 that are etched by the first etching process collectively form a first recessed region 34. On the other hand, the portions of the active regions 12 (the terminal portions 12b), the isolation structure 14 and the word lines 16 protected by the island features 20 from being etched by the first etching process form a plurality of island structures 32. Because the island features 20 are separated from each other, the first recessed region 34 may be a continuous region and completely surrounds each of the island structures 32. In other words, the island structures 32 are separated from each other by the first recessed region 34. According to an embodiment, the central portions 12a of the active regions 12 may be recessed to a pre-determined depth D1 for forming the bit line contacting regions. For example, the depth D1 may range from 400 to 450 angstroms, but not limited thereto. Notably, the isolation structure 14 exposed from the space 20a may be recessed to a depth D2. For example, the depth D2 may range from 0 to 50 angstroms, but not limited thereto. It is important that the top surfaces of the terminal portions 12b are still covered by an insulating layer (such as the optional insulating layer formed before forming the island features 20 or an pad layer on upper surface of the substrate 10 before forming the active regions 12) after the first etching process to prevent the direct contact between the terminal portions 12b and a portion of the bit lines 42 passing between the terminal portions 12b.

In conventional process of forming the bit line contacting regions of a DRAM device, a patterned mask layer comprising a plurality of opening features are formed on the substrate to expose the central portions of the active regions to be etched. However, as the DRAM device continues to shrink and the opening features become smaller, it is more difficult to form the opening features with uniform dimensions, and it is also harder to uniformly etch the central portions to a pre-determined depth through the smaller opening features. Consequently, the risk of storage node contacts directly contacting the bit line contacting regions may increase, which will result in serious DRAM failure.

One feature of the invention is that, instead of forming opening features to expose the central portions of the active regions to be etched, a plurality of island features are formed to cover the terminal portions of the active regions that are not to be etched when recessing the central portions. The overall exposed area of the substrate is increased, and more important, the spaces between the island features may facilitate the etchant of the etching process to flow more uniformly across the exposed region of the substrate. In this way, a uniform etching rate across the substrate and a uniform etching depth of the central portions of the active regions may be obtained.

Furthermore, in comparison with defining opening features in the patterned mask layer, the dimensions and shapes of the island features may be better controlled. The process window of forming island features to completely covering the terminal portions of the active regions is larger than that of forming opening features to completely exposing the central portions of the active region. As a result, the leakage problem between bit line and storage node in conventional DRAM manufacturing may be resolved.

Figure 4:
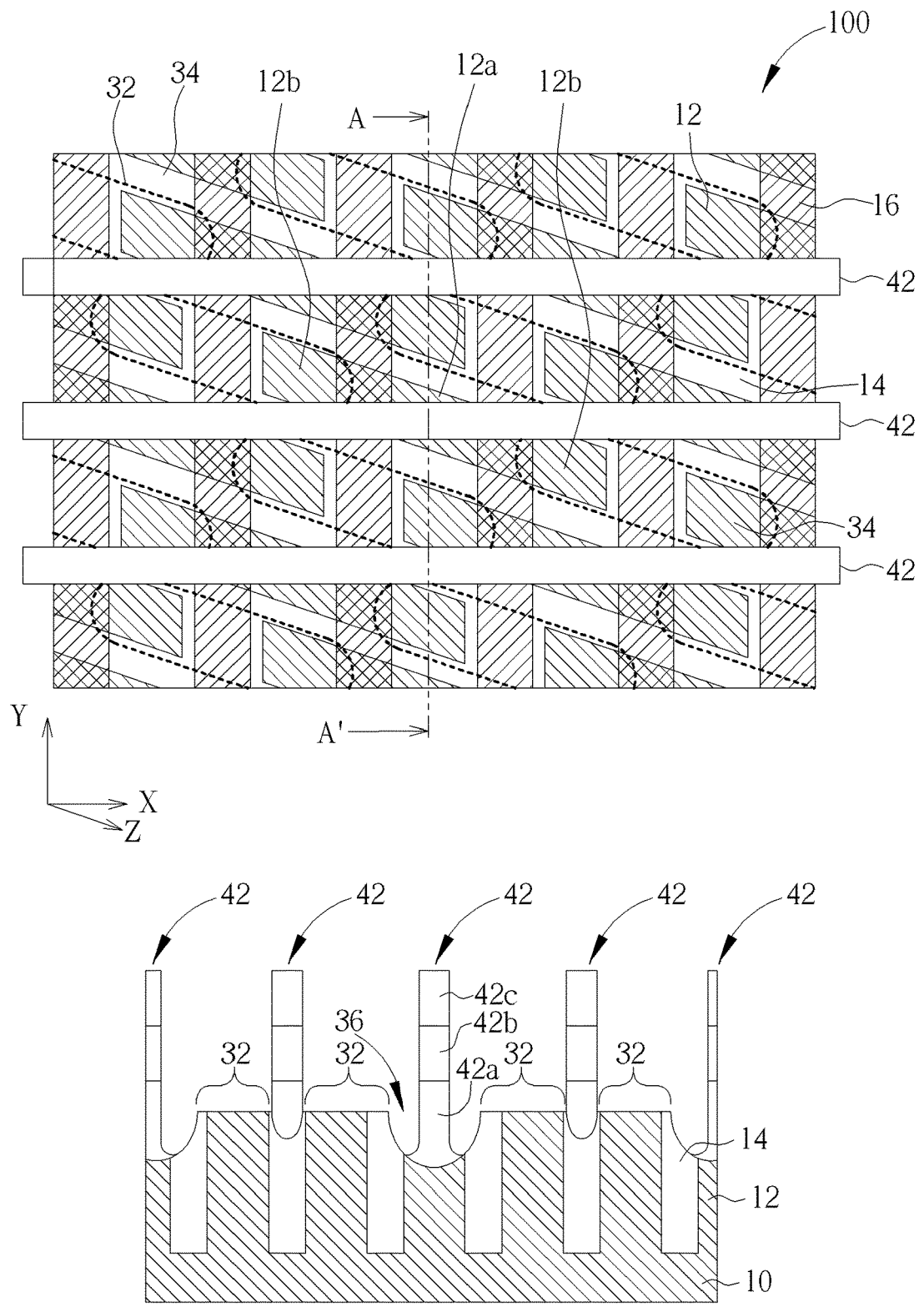

Please refer to FIG. 4. After forming the first recessed region 34 and the island structures 32 on the substrate 10, a plurality of bit lines 42 are formed on the substrate 10. The bit lines 42 are extending along an X direction that is perpendicular to the Y direction and are arranged in parallel along the Y direction. According to an embodiment, the bit lines 42 may be formed by the following steps. First, a non-metal conductive layer 42a, a metal layer 42b and a hard mask layer 42c are formed on the substrate 10 in a blanket manner, completely covering the island structures 32 and the first recessed region 34. A patterning process such as a photo-lithography etching process is then carried out to pattern the non-metal conductive layer 42a, the metal layer 42b and the hard mask layer 42c to form the bit lines 42. According to an embodiment, the non-metal conductive layer 42a may comprise polysilicon, amorphous silicon, silicon-containing non-metal conductive material or non-silicon based non-metal conductive materials. The metal layer 42b may comprise a metal such as aluminum, tungsten, copper, titanium aluminum alloy, or other low-resistivity metal materials. The hard mask layer 42c may comprise silicon nitride, silicon oxynitride, silicon carbon nitride or dielectric materials. A barrier layer (not shown) comprising titanium, tantalum, titanium nitride, tantalum nitride, tungsten silicide (WSi), tungsten nitride (WN) or other barrier materials may be disposed between the non-metal conductive layer 42a and the metal layer 42b. As shown in FIG. 4, the bit lines 42 traverse through the first recessed region 34, pass through the spaces between island structures 32 and overlap the active regions 12 on the central portions 12a to electrically connect to the central portions 12a of the active regions 12. It is noteworthy that a portion of the central portions 12a may be exposed from the space 36 between the lower sidewalls of the bit lines 42 and the island structures 32.

Figure 5:
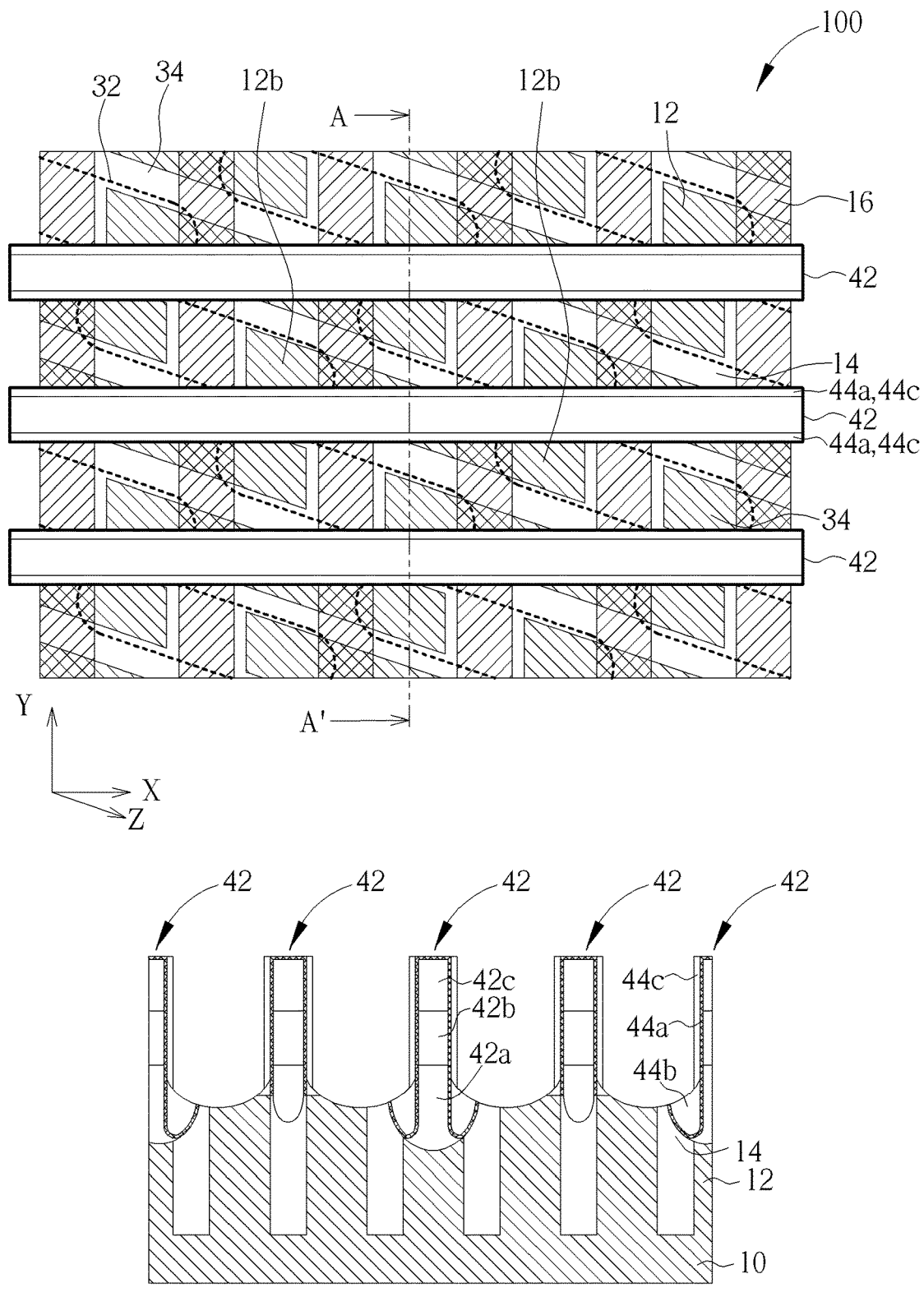

Please refer to FIG. 5. Subsequently, a first spacer 44a and a second spacer 44b are formed on sidewalls of the bit lines 42 and filling into the spaces 36 between the lower sidewalls of the bit lines 42 and the island structures 32. The method for forming the first spacer 44a and the second spacer 44b may include the following steps. First, a first spacer material layer (not shown) and a second spacer material layer (not shown) are successively formed on the substrate 10 and covering sidewalls and top surfaces of the bit lines. An anisotropic etching process is then performed to remove unnecessary portions of the first spacer material layer and the second spacer material layer and leave the remaining first spacer material layer and second spacer material layer only covering on sidewalls of the bit lines 42 and the island structures 32 and respectively becoming the first spacer 42a and the second spacer 42b. According to an embodiment, the first spacer 44a and the second spacer 44b may comprise a same or different insulating material, such as silicon oxide, silicon nitride, silicon oxynitride or silicon carbon nitride, but not limited thereto. As shown in the lower portion of FIG. 5, the spaces 36 between the lower sidewalls of the bit lines 42 and the island structures 32 are conformally covered by the first spacer 44a and completely filled by the second spacer 44b. The portions of the central portions 12a of the active regions 12 exposed from the spaces 36 are completely covered and isolated by the first spacer 44a and the second spacer 44b. Optionally, a third spacer 44c, such as a silicon oxide layer, may be formed on the first spacer 44a and the second spacer 44b to reinforce the isolation between the bit lines 42 and the storage node contacts 62 (formed later as shown in FIG. 7).

Figure 6:
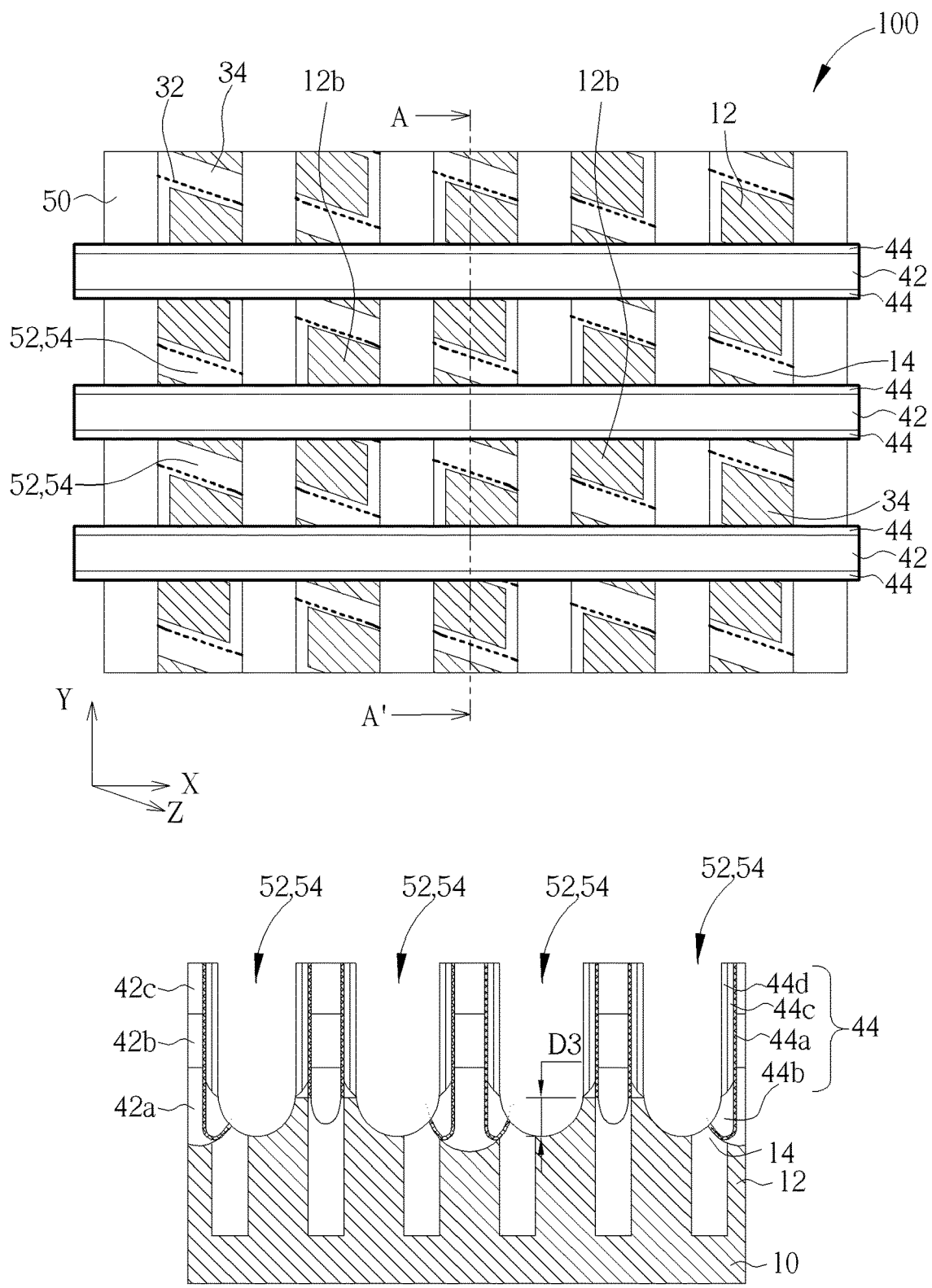

Please refer to FIG. 6. After forming the first spacer 44a, the second spacer 44b and the third spacer 44c, an interlayer dielectric layer 50 may be formed on the substrate 10 in a blanket manner and a planarization process may be performed to remove unnecessary portions of the interlayer dielectric layer 50 until the hard mask layer 42c of the bit lines 42 are exposed. A patterning process such as a photolithography-etching process is then carried out to define a plurality of openings 52 in the interlayer dielectric layer 50 between the bit lines 42 to expose the terminal portions 12b of the active regions 12, which are also parts of the island structures 32. The first recessed region 34 also partially exposed from the openings 52. According to an embodiment, after forming the openings 52, a remaining portion of the interlayer dielectric layer 50 may still cover on the sidewalls of the bit lines 42 and becomes a fourth spacer 44d. The first spacer 44a, the second spacer 44b, the third spacer 44c and the fourth spacer 44d collectively form a multi-layered spacer structure 44, which may provide a better isolation between the bit lines 42 and the storage node contacts 62.

Please still refer to FIG. 6. After forming the openings 52, a second etching process is performed, using the remaining interlayer dielectric layer 50, bit lines 42 and the spacer structure 44 as an etching mask to etch and recess the portions of island structures 32 and the portions of first recessed regions 34 exposed from the openings 52, thereby forming a plurality of second recessed regions 54 on the substrate 10. The second recessed regions 54 respectively comprise one of the recessed terminal portions 12b of the active regions 12. After the second etching process, the terminal portions 12b are recessed to a depth D3 that is smaller than the depth D1 of the recessed central portions 12a shown in FIG. 3. According to an embodiment, the depth D3 may range from 300 to 350 angstroms.

Please refer to FIG. 7. After forming the second recessed regions 54, a plurality of storage node contacts 62 are formed respectively in the openings 52 and electrically coupled to the terminal portions 12b of the active regions 12. According to an embodiment, the storage nodes 62 may be formed by the following steps. First, a conductive material 62a is formed on the substrate 10, filling lower portions of the openings 52 and directly covering the terminal portions 12b of the active regions 12. A barrier layer 62b is then formed on the conductive material 62a and conformally covering top surfaces of the conductive material 62a and sidewalls of the openings 52. Afterward, a metal layer 62c is formed on the substrate 10, completely covering the bit lines 42 and completely filling the openings 52. A planarization process such as a chemical mechanical process is then performed to remove the metal layer 62c until a predetermined thickness of the metal layer 62c is remained on top surfaces of the bit lines 42 and the interlayer dielectric layer 50. After that, a patterning process such as a photolithography-etching process is performed to remove unnecessary portions of the metal layer 62c on the top surfaces of the bit lines 42 and the interlayer dielectric layer 50, thereby patterning the metal layer 62c into a plurality of storage node contacts 62. As shown in FIG. 7, the storage node contacts 62 are arranged between bit lines 42, isolated from the bit lines by the spacer structure 44 and respectively electrically coupled to one of the terminal portions 12b of the active regions 12. As previously illustrated, by recessing the central portions 12a of the active regions 12 to a depth D1 deeper than the depth D3 of the terminal portions 12b and forming the first spacer 44a and the second spacer 44b completely filling the spaces 36 between the bottom sidewalls of the bit lines 42 and island structures 32, the central portions 12a of the active regions 12 may still be completely covered by the first spacer 44a and the second spacer 44b after the second etching process and isolated from the storage node contacts 62 by the first spacer 44a and the second spacer 44b. The leakage between storage nodes contact 62 and bit lines 42 may be avoided.

In the following description, different embodiments of the present invention are provided. To simplify the description, identical components in each of the following embodiments are marked with identical symbols. For making it easier to understand the differences between the embodiments, the following description will detail the dissimilarities among different embodiments and the identical features will not be redundantly described.

Figure 8:
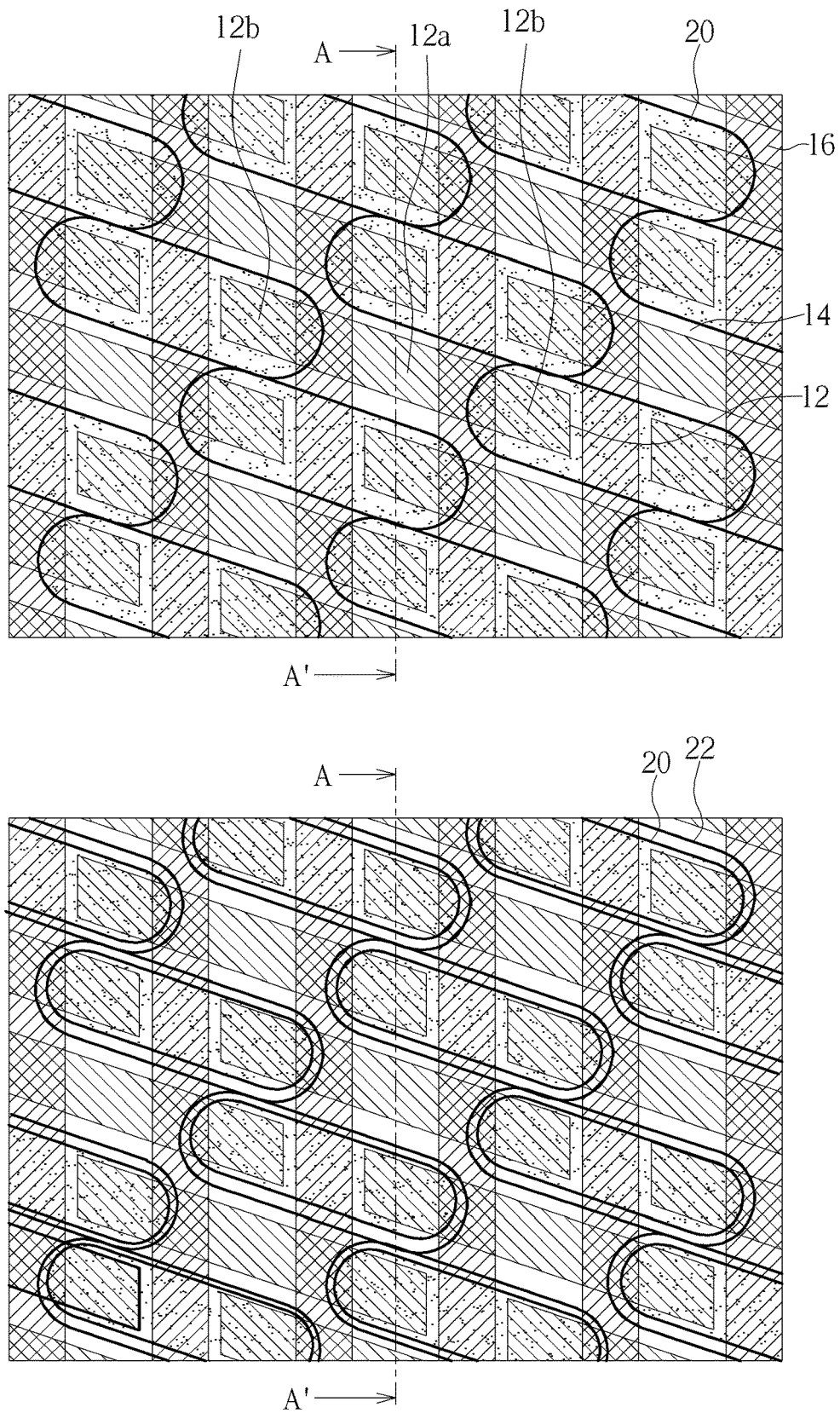
FIG. 8 shows top views of the memory device after forming island features on a substrate according to a second embodiment of the present invention.
Figure 9:
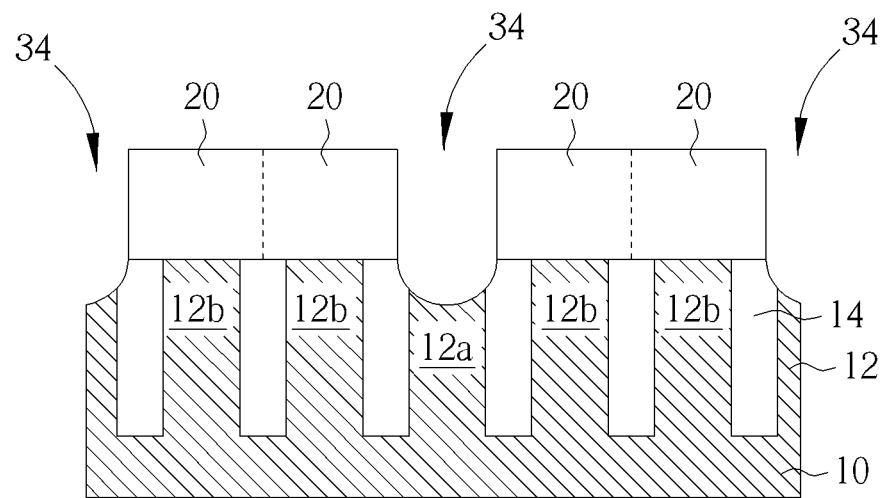
FIG. 9 shows cross-sectional views of the memory device as shown in FIG. 8 after performing a first etching process.
Figure 9:
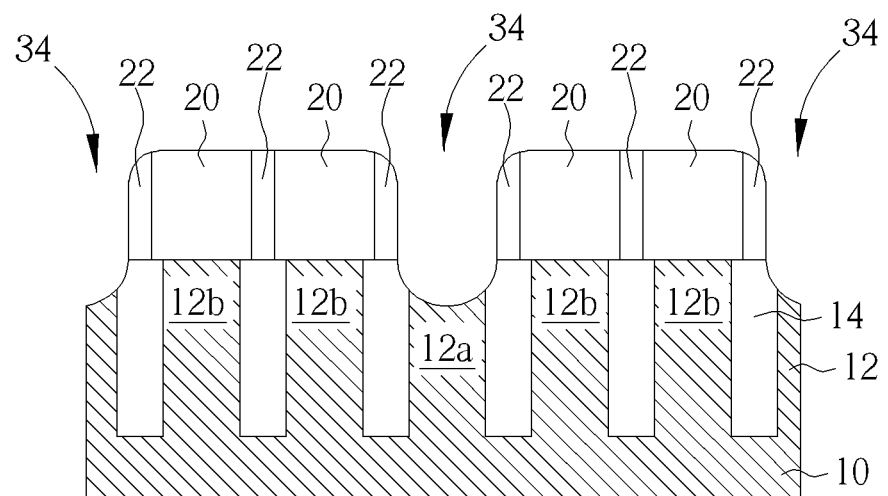

Please refer to FIG. 8 and FIG. 9, which are schematic diagrams illustrating a second embodiment of the present invention. FIG. 8 shows top views of the memory device after forming island features on a substrate according to a second embodiment of the present invention. FIG. 9 shows cross-sectional views of the memory device as shown in FIG. 8 after performing a first etching process. The difference between the second embodiment and the first embodiment as shown in FIG. 1 to FIG. 7 is that, the island features 20 as shown in the upper portion of FIG. 8 may have a larger dimension and the portions of the island features 20 on the isolation structure 14 between adjacent terminal portions 12b between word lines 16 may join together. In a modification of the second embodiment, as shown in the lower portion of FIG. 8, after forming the island features 20, liners 22 may be formed on sidewalls of the island features 20 and surrounding the island features 20. The portions of the liners 22 overlap on the isolation structure 14 between adjacent terminal portions 12b between word lines 16 may join together.

In this way, as shown in FIG. 9, the isolation structure 14 between adjacent terminal portions 12b between word lines 16 may also be completely covered by the island features 20 or the liners 22 and will not etched during the first etching process. The shallower first recessed region 34 between adjacent terminal portions 12b between as shown in the lower portion of FIG. 3 may be avoided. Therefore, no conductive material 42a of the bit lines 42 may fill into a region between adjacent terminal portions 12b, and the isolation between the adjacent terminal portions 12b and the bit lines 42 passing therebetween may be easier to maintain.

In the second embodiment, although the island features 20 are joined into plural strips of interconnected island features 20, the spaces between the strips of interconnected island features 20 still allow the etchant of the first etching process flowing across the exposed portion of substrate 10 uniformly. Therefore, a uniform etching rate across the substrate 10 may still be achieved and the central portions 12a of the active regions 12 exposed from the plural strips of interconnected island features 20 may be uniformly recessed to the pre-determined depth D1. It should be understood that, after the first etching process, plural strips of interconnected island structures 32 and a plurality of first recessed regions 34 extending continuously between the strips of island structures 32 may be formed on the substrate 10.

Figure 10:
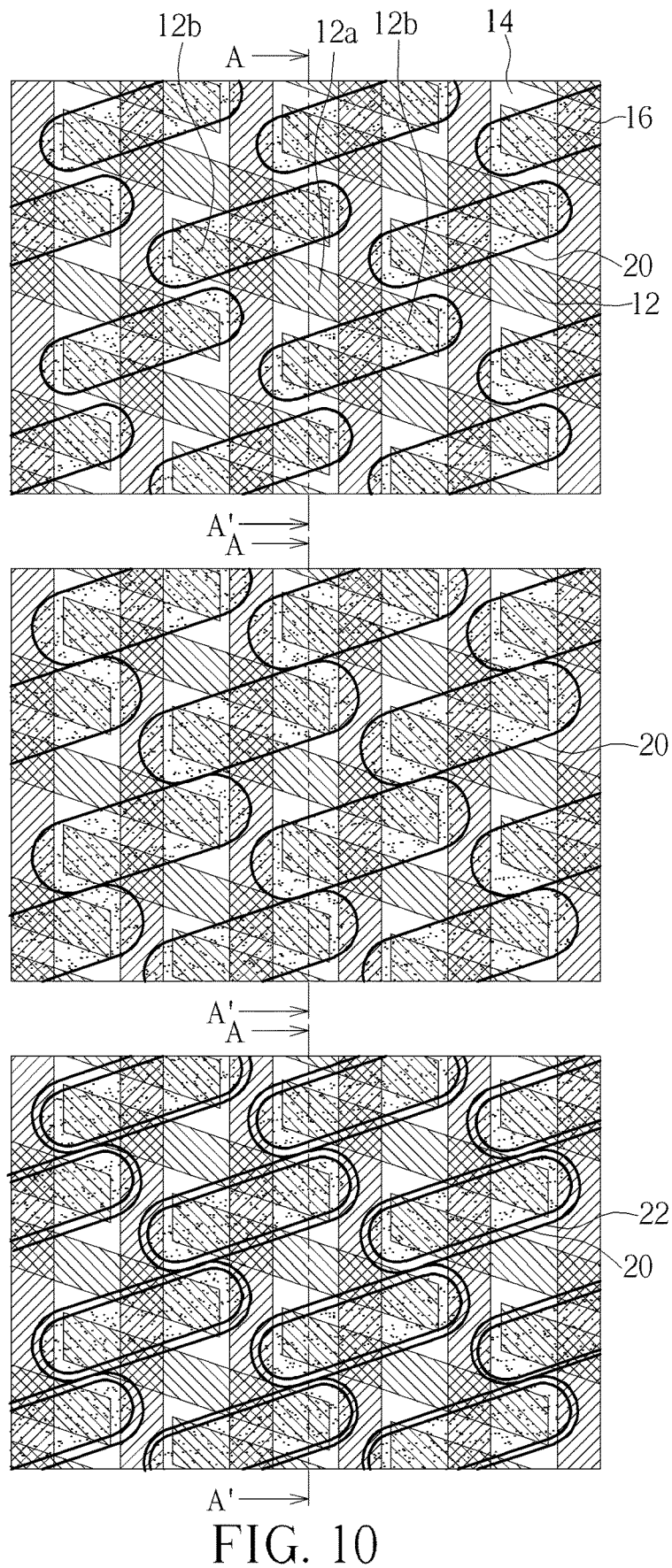
FIG. 10 shows top views of the memory device after forming island features on a substrate according to a third embodiment of the present invention.

Please refer to FIG. 10, which shows top views of the memory device after forming island features on a substrate according to a third embodiment of the present invention. The difference between the third embodiment and the first embodiment as shown in FIG. 1 to FIG. 7 is that, each island feature 20 as shown in FIG. 10 vertically overlaps on one of the second passing gate regions 16c of the buried word lines 16 and extends along a direction substantially symmetrical to the Z-direction with respect to the X-direction until completely covering the two nearby terminal portions 12b at two sides of the second passing gate region 16c. Similarly, the island features 20 may be spaced apart from each other, as shown in the upper portion of FIG. 10, or may be joined to form strips of interconnected island features, as shown in the middle portion of FIG. 10, or may be joined by the liner 22 surrounding the edges of the island features 20.

Figure 11:
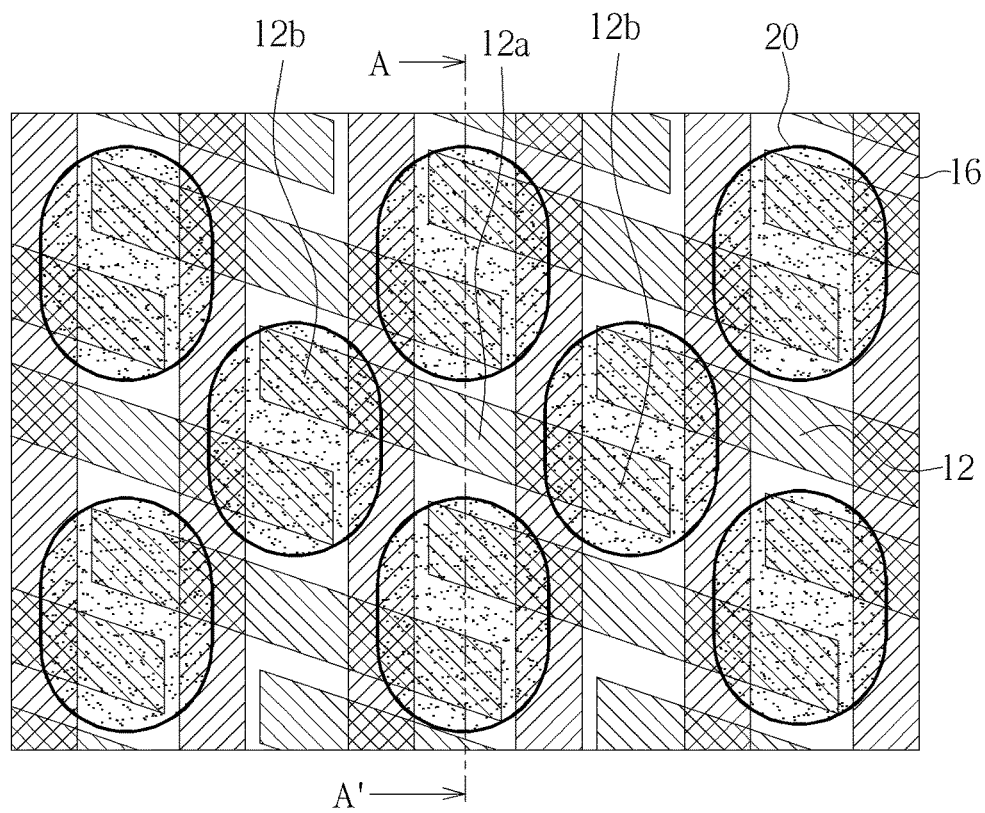
FIG. 11 shows top views of the memory device after forming island features on the substrate according to a fourth embodiment of the present invention.
Figure 11:
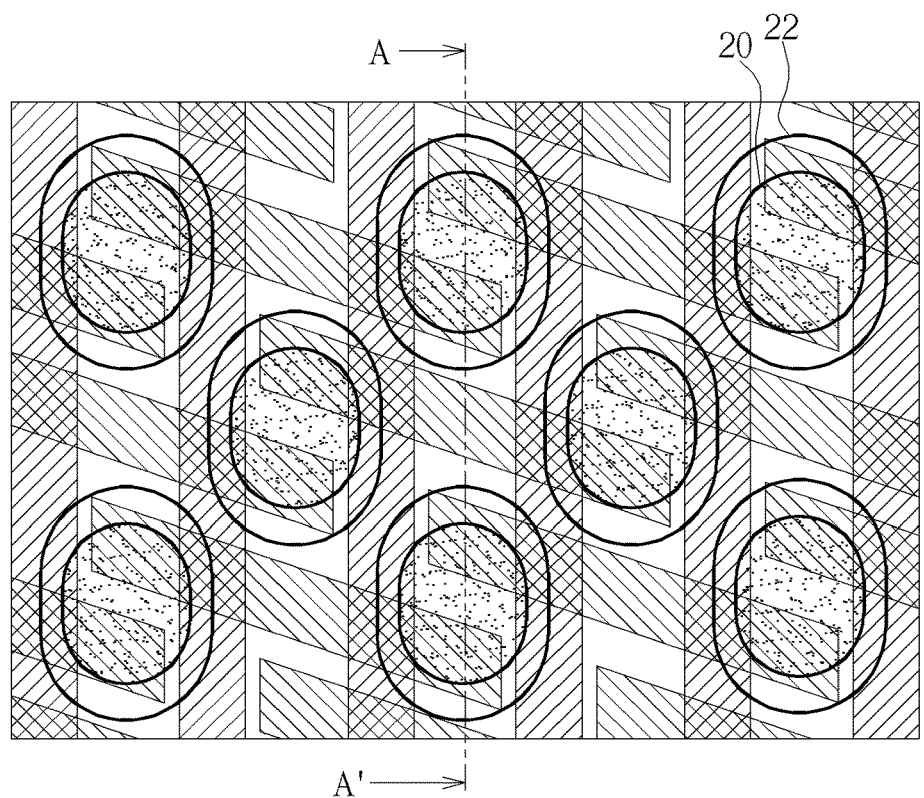
Figure 12:
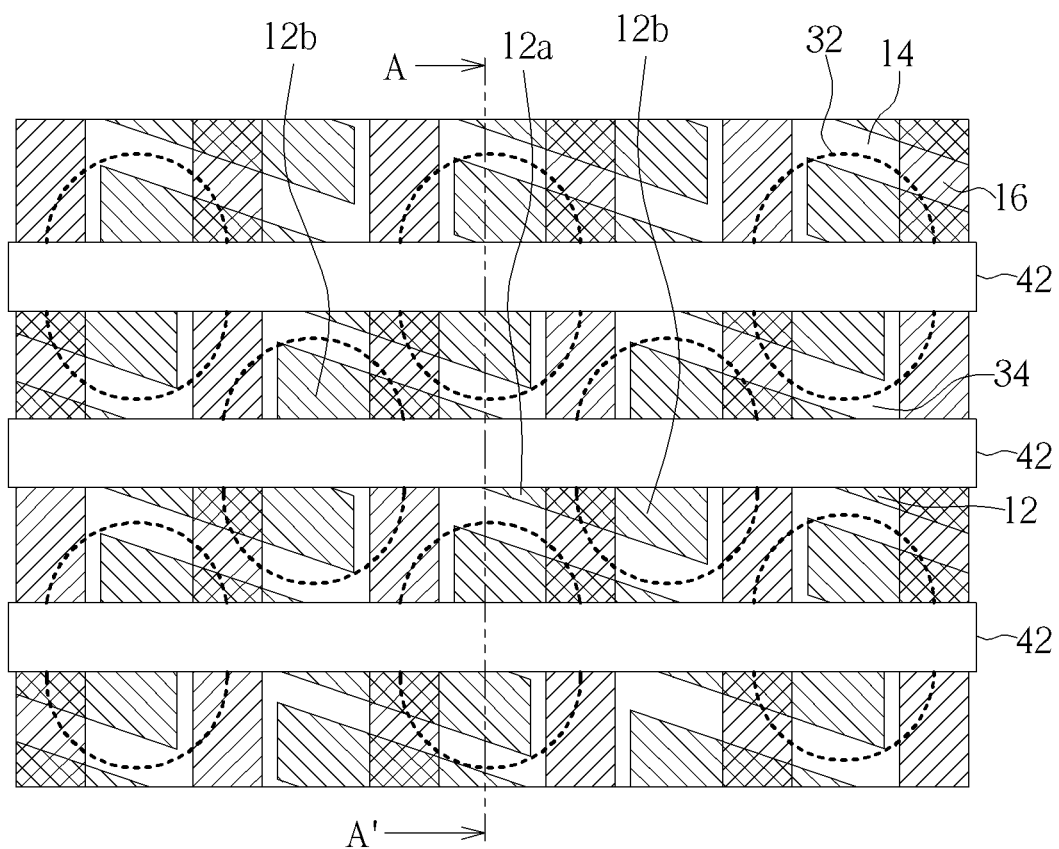
FIG. 12 shows a top view of the memory device as shown in FIG. 11 after forming bit lines on the substrate.

Please refer to FIG. 11 and FIG. 12. FIG. 11 shows top views of the memory device after forming island features on the substrate according to a fourth embodiment of the present invention. FIG. 12 shows a top view of the memory device as shown in FIG. 11 after forming bit lines on the substrate. The difference between the fourth embodiment and the first embodiment as shown in FIG. 1 to FIG. 7 is that, the island features 20 as shown in the upper portion FIG. 11 are formed between word lines 16, partially cover the word lines 16 and completely covering two adjacent terminal portions 12b between the word lines and the isolation structures 14 between the two terminal portions 12b. In this way, the isolation structures 14 between the two terminal portions 12b may be protected by the island features 20 from being etched during the first etching process, and the shallower first recessed region 34 between adjacent terminal portions 12b between as shown in the lower portion of FIG. 3 may be avoided. Therefore, no conductive material 42a of the bit lines 42 may fill into a region between adjacent terminal portions 12b, and the isolation between the adjacent terminal portions 12b and the bit lines 42 passing therebetween may be easier to maintain. In a modification of the fourth embodiment, when the dimension of the island features 20 are too small to completely cover the terminal portions 12b, a liner 22 may also be formed on sidewalls of the island features 20 and surrounding the island features 20 to ensure that the terminal portions 12b are completely covered. In the fourth embodiment, the island features 20 are spaced apart from each other, allowing the etchant of the first etching process flowing across the exposed portion of substrate 10 uniformly. Therefore, a uniform etching rate across the substrate 10 may still be achieved and the central portions 12a of the active regions 12 may be uniformly recessed to the pre-determined depth D1. Subsequently, as shown in FIG. 12, after forming the first recessed region 34, a plurality of bit lines 42 are formed on the substrate 10. Notably, in the fourth embodiment, the bit lines 42 traverse through the first recessed region 34 and stride across middle portions of the island structures 32.

Overall, in present invention, island features are formed on the substrate to cover the terminal portions of the active regions which are not to be etched when recessing the central portions of the active regions. In this way, the etchant may flow more uniformly across the surface of the substrate and therefore a uniform recessed depth of the central portions of the active regions may be achieved. Consequently, the risk of the central portions of the active regions being indirect contact with the storage node contact may be prevented. A larger process window for forming the bit line contacting regions may be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a substrate, comprising an isolation structure and a plurality of active regions defined by the isolation structure;
   a plurality of word lines formed in the substrate, wherein each of the active regions is divided into two terminal portions and a central portion between the terminal portions by two of the word lines;
   a plurality of island structures respectively comprising two of the terminal portions respectively belonging to two of the active regions; and
   a first recessed region surrounding the island structures and comprising the central portions of the active regions;
   a plurality of bit lines formed on the substrate, traversing through the first recessed regions and pass between the plurality of island structures, wherein the bit lines overlap the central portions of the active regions, and the island structures are exposed between the bit lines;
   a spacer structure on sidewalls of each of the bit lines;
   an interlayer dielectric layer on the substrate and between the bit lines;
   a plurality of openings in the interlayer dielectric layer; and
   a plurality of storage node contacts respectively in one of the openings to electrically connect to one of the terminal portions, wherein the storage node contacts are electrically isolated from the bit lines by the spacer structure.

2. The memory device according to claim 1, wherein the island structures are disposed between the word lines.

3. The memory device according to claim 2, wherein the bit lines stride across central portions of the island structures.

4. The memory device according to claim 1, wherein the island structures overlap on the word lines.

5. The memory device according to claim 4, wherein the bit lines overlap the first recessed region between the island structures.

6. The memory device according to claim 1, wherein each of the island structures further comprises a portion of the isolation structure.

7. The memory device according to claim 1, wherein the first recessed region further comprises a portion of isolation structure outside the island structures.

* * * * *